(12) United States Patent
Jeong et al.

(10) Patent No.: US 10,183,866 B2
(45) Date of Patent: Jan. 22, 2019

(54) COMPOSITION FOR FORMING CONDUCTIVE PATTERN AND RESIN STRUCTURE HAVING CONDUCTIVE PATTERN

(71) Applicant: LG CHEM, LTD., Seoul (KR)

(72) Inventors: Han Nah Jeong, Daejeon (KR); Chee-Sung Park, Daejeon (KR); Ha Na Lee, Daejeon (KR); Cheol-Hee Park, Daejeon (KR); Jae Hyun Kim, Daejeon (KR); Shin Hee Jun, Daejeon (KR); Eun Kyu Seong, Daejeon (KR); Su Jeong Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 48 days.

(21) Appl. No.: 15/510,891

(22) PCT Filed: Sep. 17, 2015

(86) PCT No.: PCT/KR2015/009786
§ 371 (c)(1),
(2) Date: Mar. 13, 2017

(87) PCT Pub. No.: WO2016/043542
PCT Pub. Date: Mar. 24, 2016

(65) Prior Publication Data
US 2017/0263349 A1  Sep. 14, 2017

(30) Foreign Application Priority Data

Sep. 17, 2014 (KR) .................. 10-2014-0123893
Sep. 16, 2015 (KR) .................. 10-2015-0130984

(51) Int. Cl.
| | | |
|---|---|---|
| *C08F 4/00* | (2006.01) | |
| *C08F 2/00* | (2006.01) | |
| *C08G 61/04* | (2006.01) | |
| *C01B 15/16* | (2006.01) | |
| *H01B 5/14* | (2006.01) | |
| *H01B 1/02* | (2006.01) | |
| *H05K 3/18* | (2006.01) | |
| *C01G 3/00* | (2006.01) | |
| *C01G 55/00* | (2006.01) | |
| *C08G 75/0209* | (2016.01) | |
| *C08L 55/02* | (2006.01) | |
| *C09D 7/61* | (2018.01) | |
| *C08K 3/32* | (2006.01) | |
| *C09D 5/24* | (2006.01) | |
| *C09D 169/00* | (2006.01) | |
| *H05K 1/09* | (2006.01) | |
| *C08G 65/38* | (2006.01) | |

(52) U.S. Cl.
CPC ............. *C01B 15/16* (2013.01); *C01G 3/006* (2013.01); *C01G 55/004* (2013.01); *C08G 75/0209* (2013.01); *C08K 3/32* (2013.01); *C08L 55/02* (2013.01); *C09D 5/24* (2013.01); *C09D 7/61* (2018.01); *C09D 169/00* (2013.01); *H01B 1/026* (2013.01); *H01B 5/14* (2013.01); *H05K 1/09* (2013.01); *H05K 3/185* (2013.01); *C01P 2002/30* (2013.01); *C01P 2004/38* (2013.01); *C08G 65/38* (2013.01); *C08K 2003/326* (2013.01); *C08K 2003/328* (2013.01); *C08L 2205/24* (2013.01); *H05K 2203/072* (2013.01); *H05K 2203/107* (2013.01)

(58) Field of Classification Search
CPC . H01B 5/14; H01B 1/026; C08K 3/22; C08K 2003/328; C08K 2003/326; H05K 1/09; H05K 2203/107; H05K 2203/072; H05K 3/185; C09D 169/00; C09D 5/24; C09D 7/1216; C09D 7/61
USPC .................................. 526/90, 89, 72; 520/1
See application file for complete search history.

(56) References Cited

U.S. PATENT DOCUMENTS

| | | |
|---|---|---|
| 8,546,066 B2 | 10/2013 | Irisawa et al. |
| 2004/0241422 A1 | 12/2004 | Naundorf et al. |
| 2005/0069688 A1 | 3/2005 | Kliesch et al. |
| 2005/0163987 A1 | 7/2005 | Kliesch et al. |
| 2006/0019076 A1 | 1/2006 | Kim et al. |
| 2008/0081207 A1 | 4/2008 | Ohsaki et al. |

(Continued)

FOREIGN PATENT DOCUMENTS

| | | |
|---|---|---|
| CN | 1518850 A | 8/2004 |
| CN | 101278607 A | 10/2008 |

(Continued)

OTHER PUBLICATIONS

Robertson et al., Acta Crystallographica. vol. 22, No. 5, May 1, 1967, pp. 665-672 (1967).

(Continued)

*Primary Examiner* — Jessica Whiteley
(74) *Attorney, Agent, or Firm* — Dentons US LLP

(57) ABSTRACT

The present invention relates to a composition for forming a conductive pattern and a resin structure having a conductive pattern, wherein the composition makes it possible to form a fine conductive pattern on various polymer resin products or resin layers through a simple process, and can more effectively meet needs of the art, such as displaying various colors. The composition for forming a conductive pattern, comprises: a polymer resin; and a non-conductive metal compound having a predetermined chemical structure, and may be a composition for forming a conductive pattern through electromagnetic irradiation, by which a metal nucleus is formed from the non-conductive metal compound.

7 Claims, 4 Drawing Sheets

(56) References Cited

U.S. PATENT DOCUMENTS

| | | |
|---|---|---|
| 2009/0277672 A1 | 11/2009 | Matsumoto |
| 2009/0292051 A1 | 11/2009 | Li et al. |
| 2011/0281135 A1 | 11/2011 | Gong et al. |
| 2012/0065313 A1 | 3/2012 | Demartin Maeder et al. |
| 2012/0082834 A1 | 4/2012 | Wermter et al. |
| 2012/0279764 A1 | 11/2012 | Jiang et al. |
| 2013/0106659 A1 | 5/2013 | Yung et al. |
| 2013/0136869 A1 | 5/2013 | Hamilton et al. |
| 2013/0289178 A1 | 10/2013 | Li et al. |
| 2014/0353543 A1 | 12/2014 | Wu et al. |
| 2016/0326652 A1* | 11/2016 | Gong et al. ......... C23C 18/1608 |
| 2017/0275764 A1 | 9/2017 | Kim et al. |

FOREIGN PATENT DOCUMENTS

| | | |
|---|---|---|
| CN | 101747650 A | 6/2010 |
| CN | 102066122 A | 5/2011 |
| CN | 102093713 A | 6/2011 |
| CN | 102714163 A | 10/2012 |
| CN | 103053227 A | 4/2013 |
| CN | 103741125 A | 4/2014 |
| CN | 103906803 A | 7/2014 |
| DE | 102011003651 A1 | 8/2012 |
| JP | 2005-097617 A | 4/2005 |
| JP | 2005195952 A | 7/2005 |
| JP | 2005-213500 A | 8/2005 |
| JP | 2006307084 A | 11/2006 |
| JP | 2007-287994 A | 11/2007 |
| JP | 2008089821 A | 4/2008 |
| JP | 2008163288 A | 7/2008 |
| JP | 2008307084 A | 12/2008 |
| JP | 2012519230 A | 8/2012 |
| JP | 2012524169 A | 10/2012 |
| JP | 2015229743 A | 12/2015 |
| KR | 10-2006-0007503 A | 1/2006 |
| KR | 10-0716486 B1 | 5/2007 |
| KR | 10-2011-0018319 A | 2/2011 |
| KR | 10-2011-0112860 A | 10/2011 |
| KR | 10-1121707 B1 | 3/2012 |
| KR | 10-1131145 B1 | 4/2012 |
| KR | 10-1333974 B1 | 11/2013 |
| KR | 10-1391187 B1 | 5/2014 |
| KR | 10-1399979 B1 | 6/2014 |
| KR | 10-1434423 B1 | 8/2014 |
| KR | 10-2014-0124918 A | 10/2014 |
| KR | 10-2015-0077609 A | 7/2015 |
| WO | 2014096153 A1 | 6/2014 |

OTHER PUBLICATIONS

Robertson et al., Canadian Journal of Chemistry, vol. 46, No. 605, Feb. 28, 1968 pp. 605-612 (1968).
Boukhari et al., Journal of Solid State Chemistry, vol. 87, No. 2, Aug. 1, 1990, pp. 251-256 (1990).
Maadi et al., Journal of Alloys and Compounds, vol. 205, No. 1-2, Mar. 1, 1994, pp. 243-247 (1994).
Bettach et al., Advanced Materials Research, vol. 1-2, Sep. 29, 1994, pp. 543-552 (1994).
Bamberger, Journal of American Ceramic Society, vol. 81, No. 1, Jan. 31, 1998, pp. 252-256 (1998).
Serghini et al., Materials Letters, vol. 22, Jan. 31, 1995, pp. 149-153 (1995).
Norindr, Florian (2009) Study of inorganic transparent materials with near-infrared absorbing properties. University of Southampton, School of Chemistry, Doctoral Thesis.
Phase Transitions, vol. 79, Nos. 6-7, pp. 535-544.
International Search Report from PCT/KR2015/009786, dated Dec. 4, 2015.
Written Opinion of the ISA from PCT/KR2015/009786, dated Dec. 4, 2015.
International Search Report from PCT/KR2015/009784, dated Dec. 4, 2015.
Written Opinion of the ISA from PCT/KR2015/009784, dated Dec. 4, 2015.

* cited by examiner

COMPOSITION FOR FORMING CONDUCTIVE PATTERN AND RESIN STRUCTURE HAVING CONDUCTIVE PATTERN

CROSS-REFERENCE TO RELATED APPLICATION

The present application is a National Stage Application No. PCT/KR2015/009786, filed Sep. 17, 2015, and claims the benefit of priority based on Korean Patent Application No. 10-2014-0123893 dated Sep. 17, 2014 and Korean Patent Application No10-2015-0130984 dated Sep. 16, 2015, all of which are hereby incorporated by reference in their entirety for all purposes as if fully set forth herein.

TECHNICAL FIELD

The present invention relates to a composition for forming a conductive pattern, which enables formation of a fine conductive pattern onto a variety of polymer resin products or resin layers by a very simplified process and is able to more effectively satisfy requirements in the art such as realization of a variety of colors, etc., and a resin structure having the conductive pattern.

BACKGROUND ART

With the recent development of microelectronic technology, a need for structures having a fine conductive pattern which is formed on the surface of a polymer resin substrate (or product) such as a variety of resin products or resin layers has grown. The conductive pattern on the surface of the polymer resin substrate may be applied to form various objects such as antennas integrated into an electronic device case, a variety of sensors, MEMS structures, RFID tags, etc.

As described above, with increasing interest in the technology of forming the conductive pattern on the surface of the polymer resin substrate, several technologies regarding this were suggested. However, a method capable of more effectively using these technologies has not been suggested yet.

For example, according to the previously known technology, a method of forming the conductive pattern by forming a metal layer on the surface of the polymer resin substrate and then applying photolithography, or a method of forming the conductive pattern by printing a conductive paste may be considered. However, when the conductive pattern is formed according to this technology, there are disadvantages that a process or equipment to be needed becomes too complicated, or it is difficult to form an excellent fine conductive pattern.

Accordingly, there is a continuous need to develop a technology capable of more effectively forming the fine conductive pattern on the surface of the polymer resin substrate by a simplified process.

As one of technologies capable of satisfying the demand in the art, a method of simply forming the conductive pattern on the surface of a polymeric resin substrate by including a specific inorganic additives in the resin, irradiating an electromagnetic wave such as laser to a region on which a conductive pattern is to be formed, and then, progressing plating on the region to which the electromagnetic wave is irradiated has been suggested.

However, in this method of forming the conductive pattern, since the kinds of inorganic additives previously suggested are extremely limitative, it is difficult to satisfy a variety of requirements of the art, for example, realization of a variety of colors, etc. Thus, there is a demand for development of various kinds of inorganic additives capable of satisfying a variety of requirements of the art.

DISCLOSURE

Technical Problem

The present invention provides a composition for forming a conductive pattern, which enables formation of a fine conductive pattern onto a variety of polymer resin products or resin layers by a very simplified process and is able to more effectively satisfy requirements in the art such as realization of a variety of colors, etc.

Further, the present invention provides a resin structure having a conductive pattern formed from the composition for forming the conductive pattern, etc. by a method of forming the conductive pattern.

Technical Solution

The present invention provides a composition for forming a conductive pattern by electromagnetic irradiation, including: a polymer resin; and a non-conductive metal compound which is represented by the following Chemical Formula 1 and has a distorted square pyramidal structure, in which Cu or M is surrounded by five oxygen atoms, or a distorted octahedral structure, in which Cu or M is surrounded by six oxygen atoms, wherein a metal core is formed from the non-conductive metal compound by electromagnetic irradiation:

$$Cu_{2-x}M_xP_2O_7 \qquad \text{[Chemical Formula 1]}$$

wherein M is one or more metals selected from the group consisting of Zn, Mg, Ca, Sr and Ba, and x satisfies the condition of $0 \leq x < 2$.

A three-dimensional structure of the non-conductive metal compound may be determined according to a kind of x and/or M of Chemical Formula 1. Specifically, when x is 0, $Cu_2P_2O_7$ may have a distorted square pyramidal structure, in which Cu is surrounded by five oxygen atoms. On the contrary, when x is more than 0 and M is Zn or Mg, the non-conductive metal compound of Chemical Formula 1 may have a distorted octahedral structure, in which Cu or M is surrounded by six oxygen atoms, or when x is more than 0 and M is Ca, Sr, or Ba, the non-conductive metal compound of Chemical Formula 1 may have a distorted square pyramidal structure, in which Cu or M is surrounded by five oxygen atoms.

Meanwhile, with regard to the composition for forming the conductive pattern, the polymer resin may include a thermosetting resin or a thermoplastic resin, and more specific examples thereof may include one or more selected from the group consisting of an acrylonitrile poly-butadiene styrene (ABS) resin, a polyalkyleneterephthalate resin, a polycarbonate resin, a polypropylene resin, and a polyphthalamide resin.

Further, with regard to the composition for forming the conductive pattern, the non-conductive metal compound may be included in an amount of approximately 0.1% by weight to approximately 15% by weight, based on the total composition.

Further, the composition for forming the conductive pattern may further include one or more additives selected from the group consisting of a flame retardant, a heat stabilizer, a UV stabilizer, a lubricant, an antioxidant, an inorganic filler, a color additive, an impact modifier, and a functional modifier.

Meanwhile, the present invention also provides a resin structure having a conductive metal layer (conductive pattern) formed on the surface of a polymer resin substrate, the conductive metal layer being obtained by using the above-described composition for forming the conductive pattern. The resin structure having the conductive pattern may include the polymer resin substrate; the non-conductive metal compound that is dispersed in the polymer resin substrate, is represented by Chemical Formula 1, and has a distorted square pyramidal structure, in which Cu or M is surrounded by five oxygen atoms, or a distorted octahedral structure, in which Cu or M is surrounded by six oxygen atoms; an adhesion-activated surface having a metal core which is exposed on the surface of a predetermined region of the polymer resin substrate; and the conductive metal layer formed on the adhesion-activated surface.

In the resin structure having the conductive pattern, the predetermined region where the adhesion-activated surface and the conductive metal layer are formed may correspond to the region of the polymer resin substrate to which an electromagnetic wave is irradiated.

Effect of the Invention

According to the present invention, provided is a composition for forming a conductive pattern, which enables formation of a fine conductive pattern onto a variety of polymer resin substrates such as polymer resin products or resin layers by a very simplified process of laser electromagnetic irradiation, and a resin structure having the conductive pattern which is formed from the composition.

Particularly, if the composition for forming the conductive pattern is used, requirement of the art such as realization of a variety of colors of a resin structure (a variety of polymer resin products, resin layers, etc.) may be more effectively satisfied, and satisfactory conductive patterns may be easily formed on the resin structure.

Therefore, the composition for forming the conductive pattern may be used to very effectively form conductive patterns for antenna on a variety of resin products, such as a mobile phone or tablet PC case, RFID tags, various sensors, MEMS structures or the like.

DETAILED DESCRIPTION OF THE EMBODIMENTS

Figure 1:
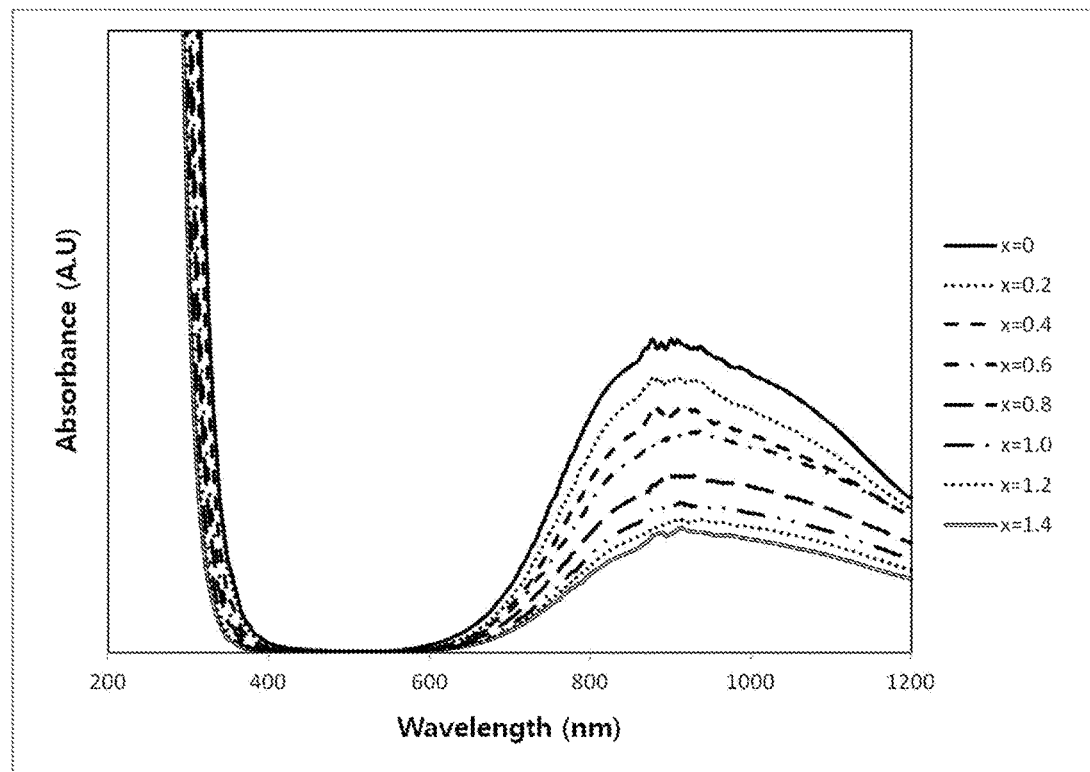
FIG. 1 is a graph showing absorbance according to a wavelength (nm) of $Cu_{2-x}Zn_xP_2O_7$ included in a composition for forming a conductive pattern according to an embodiment.

Hereinafter, a composition for forming a conductive pattern, and a resin structure having a conductive pattern formed from the composition according to specific embodiments of the present invention will be described.

According to one embodiment of the present invention, provided is a composition for forming a conductive pattern by electromagnetic irradiation, comprising: a polymer resin; and a non-conductive metal compound which is represented by the following Chemical Formula 1 and has a distorted square pyramidal structure, in which Cu or M is surrounded by five oxygen atoms, or a distorted octahedral structure, in which Cu or M is surrounded by six oxygen atoms, wherein a metal core is formed from the non-conductive metal compound by electromagnetic irradiation:

$$Cu_{2-x}M_xP_2O_7 \qquad \text{[Chemical Formula 1]}$$

wherein M is one or more metals selected from the group consisting of Zn, Mg, Ca, Sr and Ba, and x satisfies the condition of $0 \leq x < 2$.

As described in more detail below, when the composition for forming the conductive pattern including the non-conductive metal compound is used to mold a polymer resin product or a resin layer, and then a predetermined region thereof is irradiated with an electromagnetic wave ranging from approximately 700 nm to approximately 3000 nm (the near-infrared region to the infrared region), a metal core may be formed from the non-conductive metal compound. Although the non-conductive metal compound is chemically stable under general environment, the metal core may be more easily formed on a region which is exposed to an electromagnetic wave in the near-infrared region. Therefore, to easily form the conductive pattern by direct electromagnetic irradiation, the composition for forming the conductive pattern may include the non-conductive metal compound showing high absorbance in the near-infrared region.

Generally, optical property of a compound including a transition metal is associated with the d-orbital energy level. When the transition metal exists as a free atom, all d-orbitals of the transition metal have the same energy levels. However, when a ligand exists, the d-orbital energy levels of the transition metal are split into a number of sublevels according to a local symmetry formed by the metal atom and the ligand (crystal field theory). In this regard, if not all the d-orbitals of the transition metal atom are filled with electrons, electrons may jump from the lower energy level to the higher energy level, and this jump is called d-d transition of transition metal.

Since the non-conductive metal compound of Chemical Formula 1 includes $Cu^{2+}$ of which d-orbitals are partially filled with electrons, the non-conductive metal compound of Chemical Formula 1 may exhibit optical property by d-d transition. In particular, the transition between energy levels attributed to the above-described characteristic three-dimensional structure of the non-conductive metal compound represented by Chemical Formula 1 is less observed in the visible region (approximately 300 nm to approximately 700 nm), but considerably observed in the near-infrared to infrared regions (approximately 700 nm to approximately 3000 nm), and therefore, absorption of the non-conductive metal compound of Chemical Formula 1 in the near-infrared region is related to the d-orbital energy levels.

Specifically, the number of a ligand of Cu or M; and a structure formed by Cu or M and the ligand may be modified according to a kind of x and/or M of Chemical Formula 1.

For example, when x in Chemical Formula 1 satisfies the condition of 0<x<2 and M is one or more metals selected from the group consisting of Ca, Sr and Ba; or when x in Chemical Formula 1 is 0, the non-conductive metal compound of Chemical Formula 1 may include a distorted square pyramidal structure, in which Cu or M as a central atom of the local symmetry is surrounded by five oxygen atoms.

For another example, when x in Chemical Formula 1 satisfies the condition of 0<x<2 and M is one or more metals selected from the group consisting of Zn and Mg, the non-conductive metal compound of Chemical Formula 1 may include a distorted octahedral structure, in which Cu or M as the central atom of the local symmetry is surrounded by six oxygen atoms.

In the above structures, d-orbital energy levels of $Cu^{2+}$ may be formed so as to absorb an electromagnetic wave in the near-infrared region. Therefore, the non-conductive metal compound of Chemical Formula 1 may easily form a metal core by an electromagnetic wave in the near-infrared region.

In particular, $Cu^{2+}$ which is centered in the distorted square pyramid is located at a non-centrosymmetric site, and thus Laporte allowed transition occurs in the d-orbital of $Cu^{2+}$. As a result, when x in Chemical Formula 1 is 0; or x in Chemical Formula 1 satisfies the condition of 0<x<2 and M is one or more metals selected from the group consisting of Ca, Sr and Ba, the non-conductive metal compound of Chemical Formula 1 shows strong absorption band in the near-infrared region, and therefore, the metal core may be more easily formed by an electromagnetic wave in the near-infrared region.

Commonly, a non-conductive metal compound showing high absorbance in the near-infrared region also shows high absorbance in the visible region, and therefore, it is not suitable for production of polymer resin products or resin layers having many different colors. For example, because a compound having a spinel structure such as $CuCr_2O_4$, etc. has a dark black color, it is difficult to produce polymer resin products or resin layers having many different colors. In contrast, the above non-conductive metal compound of Chemical Formula 1 has low absorbance in the visible region and high absorbance in the near-infrared to infrared regions, and therefore, the compound may be used to produce polymer resin products or resin layers having many different colors.

FIG. 1 shows absorbance of $Cu_{2-x}Zn_xP_2O_7$ which is an example of the non-conductive metal compound of Chemical Formula 1. Absorbance is calculated from Equation 1 according to Kubelka-Munk equation, and R is diffuse reflectance which may be measured by UV-Visible spectroscopy.

$$\text{Absorbance} = (1-R)^2/2R (R=\text{reflectance}) \quad \text{[Equation 1]}$$

In detail, the spectrum of FIG. 1 shows the result of measuring absorbance of the $Cu_{2-x}Zn_xP_2O_7$ compound having an average particle size of 0.1 to 1 um, and shows the result of absorbance according to X value of Chemical Formula 1. Referring to FIG. 1, it was confirmed that the non-conductive metal compound of Chemical Formula 1 shows low absorbance in the visible region (approximately 300 nm to approximately 700 nm) and high absorbance in the near-infrared to infrared regions (approximately 700 nm to approximately 3000 nm). Accordingly, the non-conductive metal compound of Chemical Formula 1 may be appropriately used to produce polymer resin products or resin layers having various colors, on which fine conductive patterns are formed.

Particularly, it was confirmed in FIG. 1 that as the x value increases, absorbance in the visible region decreases, indicating that a resin structure having a brighter color may be provided by controlling a content of M, and a polymer resin product or a resin layer having a white color or a desired color may be produced even though a small amount of a pigment is added to the composition. However, the present invention is not limited to $Cu_{2-x}Zn_xP_2O_7$, and a polymer resin product or a resin layer having a bright color may be produced by controlling M and x of Chemical Formula 1.

After molding the polymer resin product or the resin layer using the composition for forming the conductive pattern including the non-conductive metal compound, metal cores may be formed from the non-conductive metal compound by irradiating an electromagnetic wave such as laser to a predetermined region. Although the non-conductive metal compound is chemically stable under general environment, the metal core may be easily formed from the non-conductive metal compound on the region which is exposed to an electromagnetic wave such as near-infrared ray, etc.

The metal core thus formed may be selectively exposed on the predetermined region to which electromagnetic wave is irradiated, to form an adhesion-activated surface on the surface of a polymeric resin substrate. Subsequently, by chemical reduction of the metal core, etc., or by electroless plating using the metal cores as a seed and a plating solution containing the conductive metal ions, a conductive metal layer may be formed on the adhesion-activated surface including the metal cores. Particularly, as described above, due to the structural characteristics of the non-conductive metal compound, when electromagnetic wave in the near-infrared region is irradiated to the non-conductive metal compound, the metal cores may be easily formed even at a low electromagnetic wave power. Further, the metal core may easily form the conductive pattern by reduction or plating, for example, by Cu-electroless plating.

Meanwhile, with regard to the composition of an embodiment, before irradiation of electromagnetic wave in the near-infrared region, the non-conductive metal compound exhibits non-conductivity and has excellent compatibility with the polymer resin, and also is chemically stable in the solution used in reduction or plating treatment, thereby maintaining non-conductivity.

Therefore, the non-conductive metal compound is uniformly dispersed in the polymer resin substrate and maintains chemically stable state to exhibit non-conductivity in the region to which electromagnetic wave is not irradiated. In contrast, the metal core may be readily generated from the non-conductive metal compound in the predetermined region to which an electromagnetic wave of the near-infrared wavelength is irradiated, as described above. Accordingly, a fine conductive pattern may be easily formed.

As such, when the above-described composition according to one embodiment is used, the fine conductive pattern may be easily formed on the polymer resin substrate such as polymer resin products or resin layers by a very simple process of laser electromagnetic irradiation. Particularly, due to the high absorbance in the near-infrared region, metal cores promoting formation of the conductive pattern may be very easily formed even at a low electromagnetic wave power. Further, the polymer resin products or resin layers are hardly colored with the non-conductive metal compound, and therefore, consumers' demand for a variety of colors of the polymer resin products may be effectively satisfied even by using a relatively small amount of color additive.

Meanwhile, in the above-described composition for forming the conductive pattern of one embodiment, any thermosetting resin or thermoplastic resin capable of forming various polymer resin products or resin layers may be used as the polymer resin without limitation. In particular, the above-described particular non-conductive metal compound may exhibit excellent compatibility and uniform dispersibility with respect to various polymer resins, and the composition of one embodiment may include various polymer resins and may be molded to various resin products or resin layers. Specific examples of the polymer resin may include an acrylonitrile poly-butadiene styrene (ABS) resin, a polyalkyleneterephthalate resin such as a polybutyleneterephthalate resin or a polyethyleneterephthalate resin, a polycarbonate resin, a polypropylene resin, a polyphthalamide resin, etc., and it may also include various other polymer resins.

Further, in the composition for forming the conductive pattern, the non-conductive metal compound of Chemical Formula 1 may be included in an amount of approximately 0.1% by weight to approximately 15% by weight, or approximately 1% by weight to approximately 10% by weight, based on the total composition, and the polymer resin may be included in the remaining amount. When the content is within the above range, the polymer resin product or the resin layer formed from the composition properly maintains the basic physical properties such as mechanical properties, and the conductive pattern is also preferably formed on a predetermined region by electromagnetic irradiation.

The composition for forming the conductive pattern may further include one or more additives selected from the group consisting of a flame retardant, a heat stabilizer, a UV stabilizer, a lubricant, an antioxidant, an inorganic filler, a color additive, an impact modifier, and a functional modifier, in addition to the above-described polymer resin and the predetermined non-conductive metal compound. By including the additives, the physical properties of the resin structure obtained from the composition of one embodiment may be appropriately modified. Among the additives, the color additive, for example, a pigment may be included in an amount of approximately 0.1% by weight to approximately 10% by weight to afford a desired color to the resin structure.

Representative examples of the color additive such as the pigment may include a white pigment such as ZnO, ZnS, Talc, $TiO_2$, $SnO_2$, $BaSO_4$, etc., and color additives such as pigments of various kinds and colors which are known to be usable in a polymer resin composition may be also used.

The flame retardant may include a phosphorous-based flame retardant and an inorganic flame retardant. More specifically, the phosphorous-based flame retardant may include phosphate ester-based flame retardants such as triphenyl phosphate (TPP), trixylenyl phosphate (TXP), tricresyl phosphate (TCP), triisophenyl phosphate (REOFOS), etc.; aromatic polyphosphate-based flame retardants; polyphosphate-based flame retardants; or red phosphorous-based flame retardant, etc., and various other phosphorous-based flame retardants known to be usable in a resin composition may be used without particular limitations. In addition, the inorganic flame retardant may include aluminum hydroxide, magnesium hydroxide, zinc borate, molybdenum oxide ($MoO_3$), molybdenum peroxide salt ($Mo_2O_7^{2-}$), calcium-zinc-molybdate, antimony trioxide ($Sb_2O_3$), antimony pentoxide ($Sb_2O_5$), etc. However, the examples of the inorganic flame retardant are not limited thereto, and various other inorganic flame retardants known to be usable in a resin composition may be used without particular limitations.

Further, the impact modifier, heat stabilizer, UV stabilizer, lubricant or antioxidant may be included in an amount of approximately 0.1% by weight to approximately 5% by weight or approximately 0.05% by weight to approximately 3% by weight to appropriately afford desired properties to the resin structure.

Hereinafter, a method of forming the conductive pattern on the polymer resin substrate such as the resin product or the resin layer by direct electromagnetic irradiation using the above-described composition for forming the conductive pattern of an embodiment will be explained in detail. The method of forming the conductive pattern may include molding the above-described composition for forming the conductive pattern to a resin product or applying it to another product to form a resin layer; irradiating an electromagnetic wave to a predetermined region of the resin product or the resin layer to generate a metal core from the non-conductive metal compound particles of Chemical Formula 1; and chemically reducing or plating the region generating the metal core to form the conductive metal layer.

Hereinafter, each step of the method of forming the conductive pattern will be described with reference to the accompanying drawings. For reference, FIG. 2 illustrates a schematic diagram showing each step of an exemplary method of forming the conductive pattern.

In the method of forming the conductive pattern, first, the above-described composition for forming the conductive pattern is molded to the resin product or applied to another product to form the resin layer. In the molding of the resin product or the forming of the resin layer, a method of molding a product or a method of forming a resin layer using a general polymer resin composition may be applied without limitation. For example, when the resin product is molded using the composition, the composition for forming the conductive pattern is extruded and cooled to form pellets or particles, which are subjected to injection-molding in a desired shape, thereby manufacturing a variety of polymer resin products.

The polymer resin product or the resin layer thus formed may have the above described particular non-conductive metal compound which is uniformly dispersed on the resin substrate formed from the polymer resin. In particular, since the non-conductive metal compound of Chemical Formula 1 has excellent compatibility and chemical stability for various polymer resins, the non-conductive metal compound is uniformly dispersed throughout the resin substrate and maintains non-conductivity.

Figure 2:
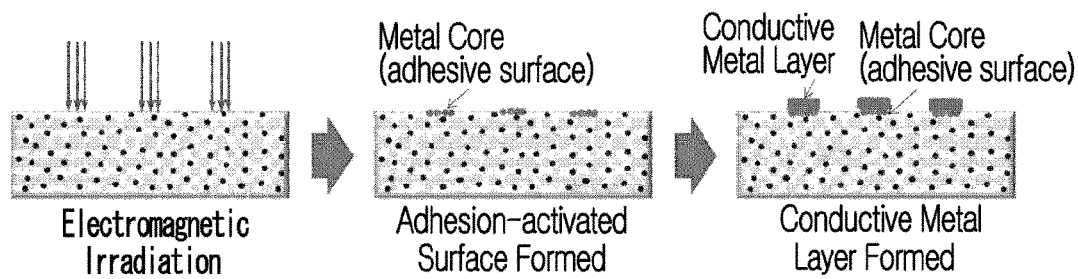
FIG. 2 is a schematic illustration showing each step of an exemplary method of forming a conductive pattern by using the composition according to an embodiment.

After forming the polymer resin product or the resin layer, as illustrated in the first figure of FIG. 2, an electromagnetic wave such as laser, etc. may be irradiated to a predetermined region of the resin product or the resin layer, on which the conductive pattern is intended to be formed. When the electromagnetic wave is irradiated, the metal cores may be generated from the non-conductive metal compound (see the second figure of FIG. 2).

More specifically, when the generating of the metal cores by electromagnetic irradiation is carried out, part of the non-conductive metal compound of Chemical Formula 1 is exposed on the surface of the predetermined region of the resin product or the resin layer, and metal cores are generated therefrom, and thus the adhesion-activated surface which is activated to have higher adhesion may be formed. Since the adhesion-activated surface is selectively formed on the specific region to which the electromagnetic wave is irradiated, the conductive metal layer may be selectively formed on the predetermined region of the polymer resin substrate by plating as described below. More specifically, upon electroless plating, the metal cores function as a kind of seed to form a strong bond with the conductive metal ions included in the plating solution, when the conductive metal ions are chemically reduced. As a result, the conductive metal layer may be selectively formed in an easier manner.

Meanwhile, in the generating of the metal cores, a laser electromagnetic wave among electromagnetic waves may be irradiated, for example, a laser electromagnetic wave in the near-infrared (NIR) region of approximately 755 nm, approximately 1064 nm, approximately 1550 nm or approximately 2940 nm may be irradiated. For another example, a laser electromagnetic wave in the infrared (IR) region may be irradiated. Further, the laser electromagnetic wave may be irradiated under common conditions or power.

By the laser electromagnetic irradiation, the metal cores may be more effectively formed from the non-conductive metal compound of Chemical Formula 1, and the adhesion-activated surface including the same may be selectively formed on the predetermined region and exposed.

Meanwhile, after the generating of the metal cores, as illustrated in the third figure of FIG. 2, the forming of the conductive metal layer by chemically reducing or plating the region generating metal cores may be carried out. As a result of the reducing or plating, the conductive metal layer may be selectively formed on the predetermined region exposing the metal core and the adhesion-activated surface, and the chemically stable non-conductive metal compound maintains its non-conductivity on the other region. Therefore, the fine conductive pattern may be selectively formed only on the predetermined region of the polymer resin substrate.

More specifically, the forming of the conductive metal layer may be progressed by electroless plating, thereby forming a satisfactory conductive metal layer on the adhesion-activated surface. Particularly, the adhesion-activated surface formed from the non-conductive metal compound of Chemical Formula 1 may rapidly form the fine conductive pattern having excellent adhesion strength by Cu-electroless plating.

For example, in the reducing or plating, the predetermined region of the resin product or the resin layer which generates metal cores may be treated with an acidic or basic solution containing a reducing agent, and this solution may contain one or more selected from the group consisting of formaldehyde, hypophosphite, dimethylamino borane (DMAB), diethylaminoborane (DEAB) and hydrazine as the reducing agent. Further, in the reducing or plating, the region may be treated with an electroless plating solution containing the reducing agent and conductive metal ions to form the conductive metal layer by electroless plating.

As the reducing or plating is carried out, the conductive metal ions in the plating solution are chemically reduced in the region where the metal cores are formed as a seed, and therefore, an excellent conductive pattern may be selectively formed on the predetermined region. In this regard, the metal core and the adhesion-activated surface may form a strong bond with chemically reduced conductive metal ions, and as a result, the conductive pattern may be more easily formed selectively on the predetermined region.

Further, in the remaining region on which the conductive pattern is not formed, the non-conductive metal compound of Chemical Formula 1 is uniformly dispersed in the resin structure.

Meanwhile, according to still another embodiment, provided is a resin structure having the conductive pattern which is obtained by using the composition for forming the conductive pattern and the method of forming the conductive pattern. The resin structure may include the polymer resin substrate; the non-conductive metal compound that is dispersed in the polymer resin substrate and is represented by Chemical Formula 1, and has a distorted square pyramidal structure, in which Cu or M is surrounded by five oxygen atoms, or a distorted octahedral structure, in which Cu or M is surrounded by six oxygen atoms; an adhesion-activated surface having a metal core which is exposed on the surface of a predetermined region of the polymer resin substrate; and the conductive metal layer formed on the adhesion-activated surface.

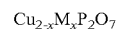   [Chemical Formula 1]

wherein M is one or more metals selected from the group consisting of Zn, Mg, Ca, Sr and Ba, and x satisfies the condition of $0 \leq x < 2$.

In the resin structure, the predetermined region where the adhesion-activated surface and the conductive metal layer are formed may correspond to the region of the polymer resin substrate to which the electromagnetic wave is irradiated. In addition, the metal or the ion thereof included in the metal cores of the adhesion-activated surface may be derived from the non-conductive metal compound of Chemical Formula 1. Meanwhile, the conductive metal layer may be derived from the metal included in the non-conductive metal compound of Chemical Formula 1 or from the conductive metal ion included in the electroless plating solution.

Further, the resin structure may further include residues which are derived from the non-conductive metal compound. These residues may have a structure in which the metal is at least partially released from the non-conductive metal compound, and therefore, vacancy is formed in at least one portion of the compound.

The above-described resin structure may be applied to a variety of resin products or resin layers having conductive patterns for antenna, such as a mobile phone or tablet PC case, or to a variety of resin products or resin layers having the conductive pattern, such as RFID tags, various sensors, MEMS structure, etc.

As described above, according to embodiments of the present invention, it is possible to manufacture a variety of resin products having different fine conductive patterns by a very simplified process of including laser electromagnetic irradiation and reduction or plating treatment.

Hereinafter, actions and effects of the present invention will be described in more detail with reference to specific Examples of the present invention. However, these Examples are provided only for illustrative purposes and are not intended to limit the scope of the present invention.

EXAMPLE 1

Formation of Conductive Pattern by Direct Electromagnetic Irradiation

A polycarbonate resin as a basic resin and $Cu_2P_2O_7$ which is a non-conductive metal compound having a distorted square pyramidal structure, in which Cu is surrounded by five oxygen atoms, were used, and additives for processing and stabilization were also used to prepare a composition for forming a conductive pattern by electromagnetic irradiation.

A heat stabilizer (IR1076, PEP36), a UV stabilizer (UV329), a lubricant (EP184), and an impact modifier (S2001) were used as the additives.

The polycarbonate resin of 90% by weight, $Cu_2P_2O_7$ of 5% by weight, and other additives of 5% by weight were mixed to obtain a composition, and the composition was extruded in an extruder at 260° C. to 280° C. A pellet-type composition thus extruded was subjected to injection-molding at approximately 260° C. to approximately 270° C. to give a substrate having a width of 100 mm, a length of 100 mm, and a thickness of 2 mm The injection-molded sample was irradiated with laser having a wavelength of 1064 nm under the conditions of 40 kHz and 12 W to activate the surface, and an electroless plating process was carried out as follows.

A plating solution was prepared by dissolving 3 g of copper sulfate, 14 g of Rochelle salt, and 4 g sodium hydroxide in 100 ml of deionized water. 1.6 ml of formaldehyde as a reducing agent was added to 40 ml of the prepared plating solution. The resin structure, of which surface was activated by laser, was immersed in the plating solution for 4 to 5 hours, followed by washing with distilled water.

Finally, a superior conductive pattern (copper metal layer) was formed by electroless plating of the surface which was activated by laser irradiation of 12 W.

EXAMPLE 2

Formation of Conductive Pattern by Direct Electromagnetic Irradiation

A resin structure having a conductive pattern was manufactured in the same manner as in Example 1, except that a pigment $TiO_2$ of 5% by weight was added to the composition for forming the conductive pattern of Example 1, and the content of the polycarbonate resin of 85% by weight was used.

EXAMPLE 3

Formation of Conductive Pattern by Direct Electromagnetic Irradiation

Figure 3:
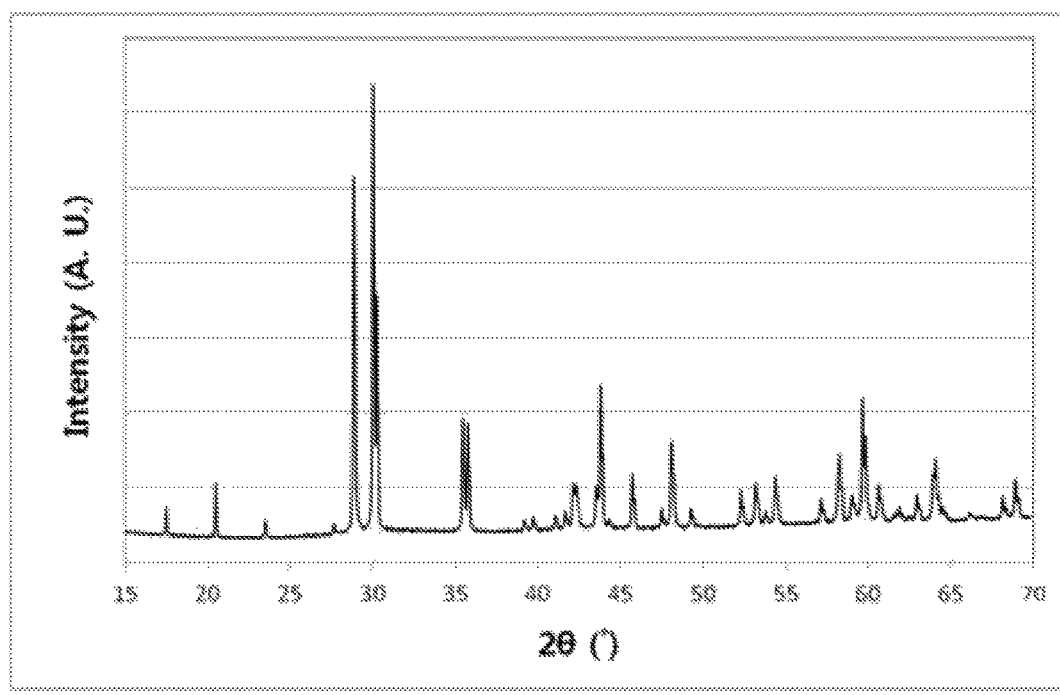
FIG. 3 shows an XRD pattern of a non-conductive metal compound synthesized in Example 3.

CuO, ZnO and $(NH_4)_2HPO_4$ were mixed at a molar ratio of 1:1:2. A mixture thus obtained was heat-treated at 950° C. for 10 hours. XRD patterns showing crystal properties of $CuZnP_2O_7$ synthesized under the above conditions are shown in FIG. 3. $CuZnP_2O_7$ synthesized under the above conditions had a distorted octahedral structure, in which Cu or Zn is surrounded by six oxygen atoms.

A resin structure having a conductive pattern was manufactured in the same manner as in Example 1, except that the synthesized $CuZnP_2O_7$ was used as the non-conductive metal compound instead of $Cu_2P_2O_7$ in Example 1.

EXAMPLE 4

Formation of Conductive Pattern by Direct Electromagnetic Irradiation

Figure 4:
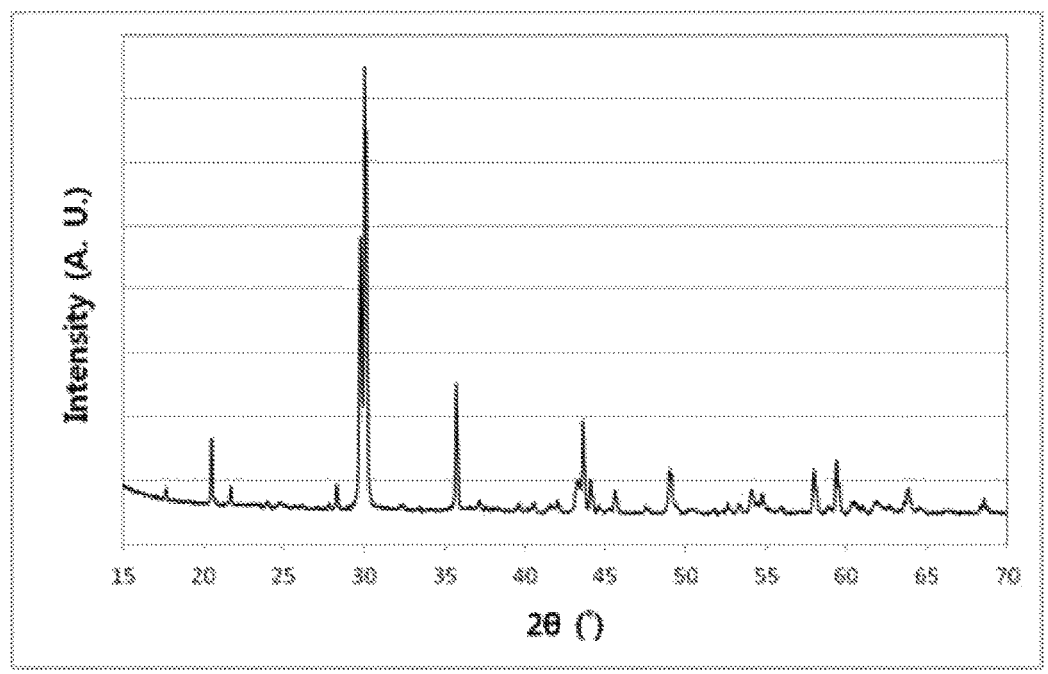
FIG. 4 shows an XRD pattern of a non-conductive metal compound synthesized in Example 4.

CuO, MgO and $(NH_4)_2HPO_4$ were mixed at a molar ratio of 1:1:2. A mixture thus obtained was heat-treated at 950° C. for 10 hours. XRD patterns showing crystal properties of $CuMgP_2O_7$ synthesized under the above conditions are shown in FIG. 4. $CuMgP_2O_7$ synthesized under the above conditions had a distorted octahedral structure, in which Cu or Mg is surrounded by six oxygen atoms.

A resin structure having a conductive pattern was manufactured in the same manner as in Example 1, except that the synthesized $CuMgP_2O_7$ was used as the non-conductive metal compound instead of $Cu_2P_2O_7$ in Example 1.

EXAMPLE 5

Formation of Conductive Pattern by Direct Electromagnetic Irradiation

Figure 5:
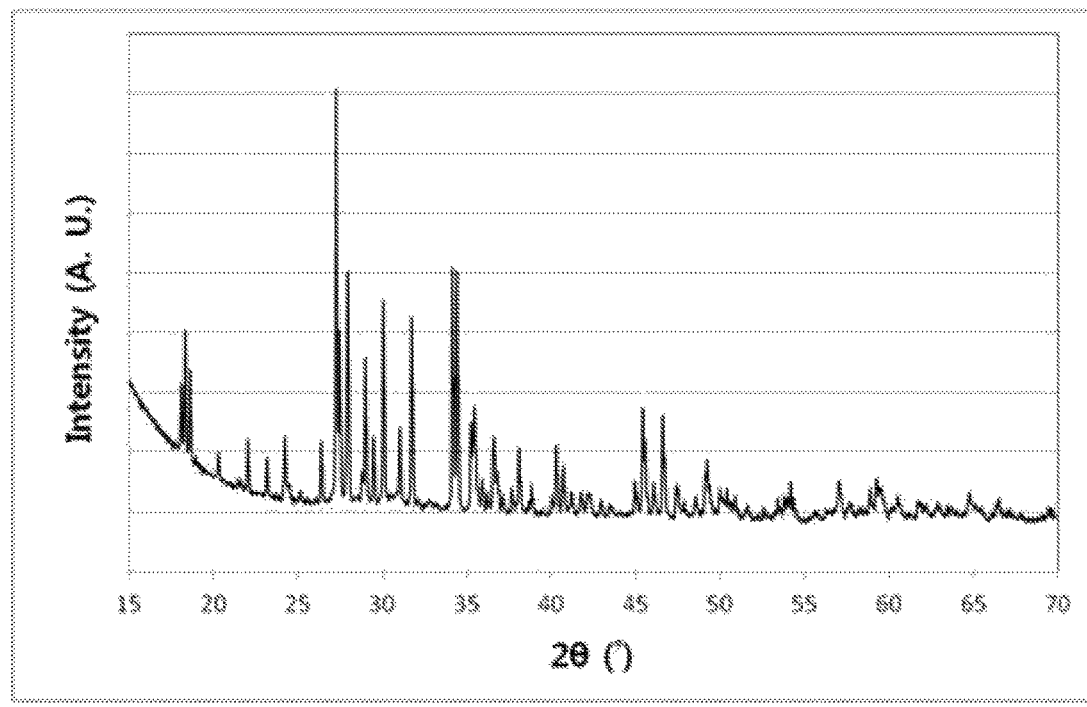
FIG. 5 shows an XRD pattern of a non-conductive metal compound synthesized in Example 5.

CuO, CaO and $(NH_4)_2HPO_4$ were mixed at a molar ratio of 1:1:2. A mixture thus obtained was heat-treated at 950° C. for 10 hours. XRD patterns showing crystal properties of $CuCaP_2O_7$ synthesized under the above conditions are shown in FIG. 5. $CuCaP_2O_7$ synthesized under the above conditions had a distorted square pyramidal structure, in which Cu or Ca is surrounded by five oxygen atoms.

A resin structure having a conductive pattern was manufactured in the same manner as in Example 1, except that the synthesized $CuCaP_2O_7$ was used as the non-conductive metal compound instead of $Cu_2P_2O_7$ in Example 1.

EXAMPLE 6

Formation of Conductive Pattern by Direct Electromagnetic Irradiation

Figure 6:
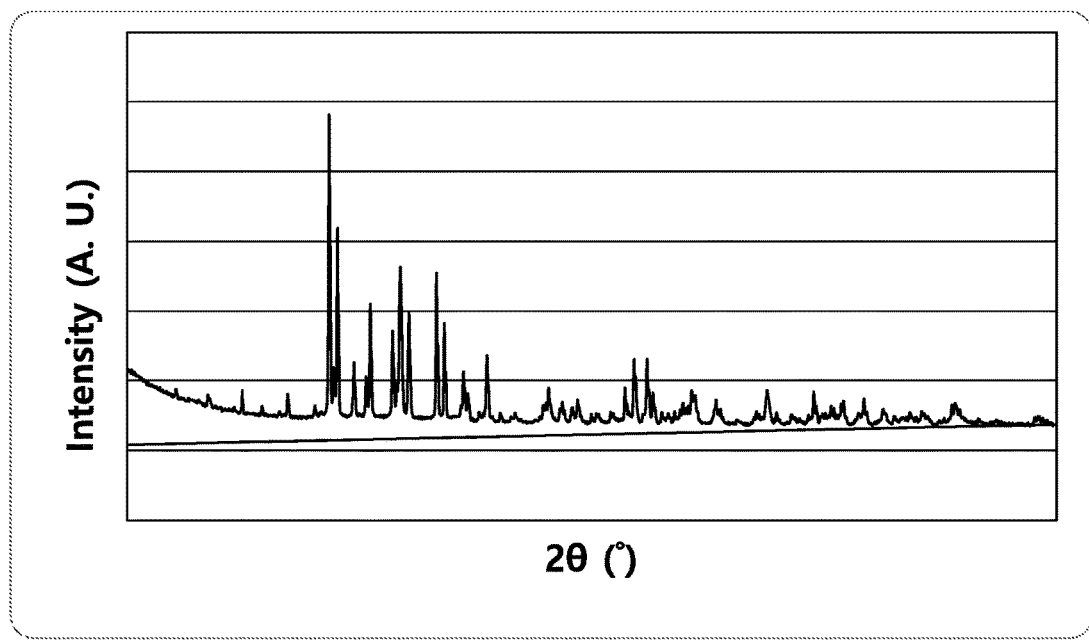
FIG. 6 shows an XRD pattern of a non-conductive metal compound synthesized in Example 6.

CuO, $SrCO_3$ and $(NH_4)_2HPO_4$ were mixed at a molar ratio of 1:1:2. A mixture thus obtained was heat-treated at 500° C. for 5 hours, and then heat-treated at 950° C. for 10 hours. XRD patterns showing crystal properties of $CuSrP_2O_7$ synthesized under the above conditions are shown in FIG. 6. $CuSrP_2O_7$ synthesized under the above conditions had a distorted square pyramidal structure, in which Cu or Sr is surrounded by five oxygen atoms.

A resin structure having a conductive pattern was manufactured in the same manner as in Example 1, except that the synthesized $CuSrP_2O_7$ was used as the non-conductive metal compound instead of $Cu_2P_2O_7$ in Example 1.

EXAMPLE 7

Formation of Conductive Pattern by Direct Electromagnetic Irradiation

Figure 7:
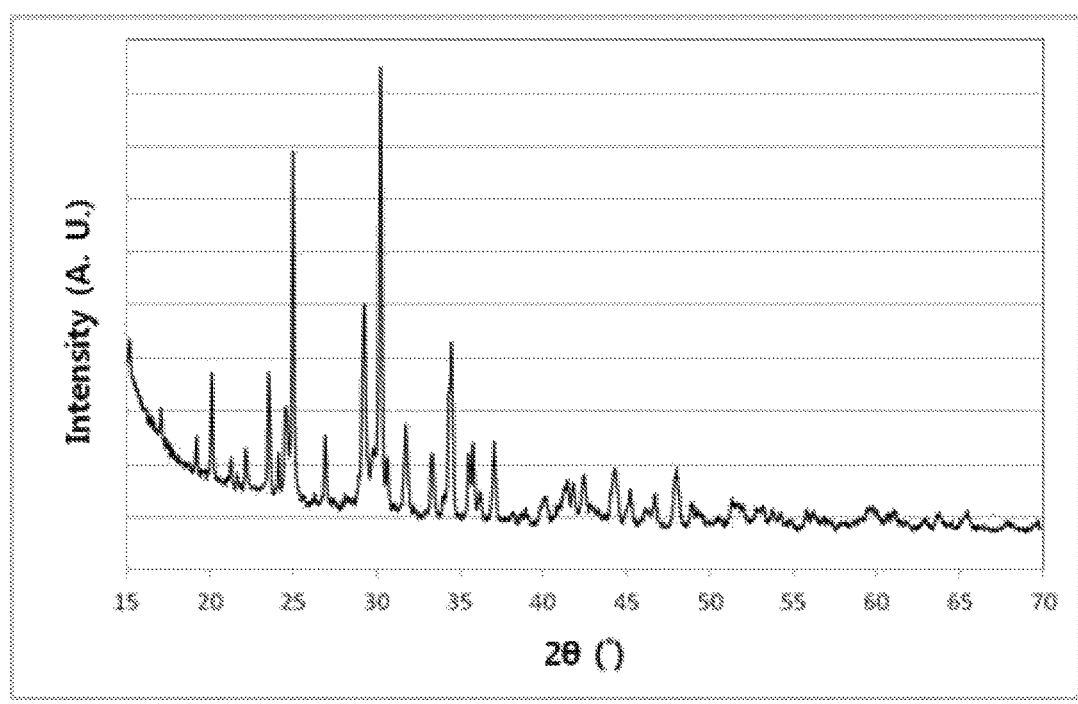
FIG. 7 shows an XRD pattern of a non-conductive metal compound synthesized in Example 7.

CuO, $Ba(C_2H_3O_2)_2$ and $(NH_4)_2HPO_4$ were mixed at a molar ratio of 1:1:2. A mixture thus obtained was heat-treated at 500° C. for 5 hours, and then heat-treated at 850° C. for 10 hours. XRD patterns showing crystal properties of $CuBaP_2O_7$ synthesized under the above conditions are shown in FIG. 7. $CuBaP_2O_7$ synthesized under the above conditions had a distorted square pyramidal structure, in which Cu or Ba is surrounded by five oxygen atoms.

A resin structure having a conductive pattern was manufactured in the same manner as in Example 1, except that the synthesized $CuBaP_2O_7$ was used as the non-conductive metal compound instead of $Cu_2P_2O_7$ in Example 1.

COMPARATIVE EXAMPLE 1

Formation of Conductive Pattern by Direct Electromagnetic Irradiation

A resin structure having a conductive pattern was manufactured in the same manner as in Example 1, except that $CuCr_2O_4$ was used as the non-conductive metal compound instead of $Cu_2P_2O_7$ in Example 1.

COMPARATIVE EXAMPLE 2

Formation of Conductive Pattern by Direct Electromagnetic Irradiation

In the same manner as in Example 1, the polycarbonate resin, the non-conductive metal compound, and other additives were mixed to obtain a composition, and the composition was extruded in an extruder at a temperature of 260 to 280° C., except that $CuF_2$ was used as the non-conductive metal compound instead of $Cu_2P_2O_7$ in Example 1. However, the polycarbonate resin was decomposed by $CuF_2$, and thus a pellet-type composition was not obtained. Further, each of $CuF_2$ and the polycarbonate resin had light colors, but the color of the polycarbonate resin turned black by mixing with $CuF_2$. As a result, a resin composition in which $CuF_2$ was dispersed was not obtained, and therefore, a resin structure having a conductive pattern which was formed on a desired region was not manufactured.

COMPARATIVE EXAMPLE 3

Formation of Conductive Pattern by Direct Electromagnetic Irradiation

In the same manner as in Example 1, the polycarbonate resin, the non-conductive metal compound, and other additives were mixed to obtain a composition, and the composition was extruded in an extruder at a temperature of 260 to 280° C., except that $Cu_2P_2O_7 \cdot 3H_2O$ was used as the non-conductive metal compound instead of $Cu_2P_2O_7$ in Example 1. However, the polycarbonate resin was decomposed by $Cu_2P_2O_7 \cdot 3H_2O$ at the high temperature, and thus a pellet-type composition was not obtained. As a result, a resin composition in which $Cu_2P_2O_7 \cdot 3H_2O$ was uniformly dispersed was not obtained, and therefore, a resin structure having a conductive pattern which was formed on a desired region was not manufactured.

COMPARATIVE EXAMPLE 4

Formation of Conductive Pattern by Direct Electromagnetic Irradiation

To synthesize $CuFeP_2O_7$, CuO, $Fe_2O_3$ and $(NH_4)_2HPO_4$ were mixed at a molar ratio of 1:0.5:2. A mixture thus obtained was heat-treated at 950° C. for 10 hours. As a result, $CuFeP_2O_7$ was not synthesized, and copper phosphate and iron phosphate were synthesized, respectively. Accordingly, it was confirmed that metals to be doped on $Cu_2P_2O_7$ are restrictive, and only M of Chemical Formula 1 suggested in the present invention is able to provide a non-conductive metal compound having a specific three-dimensional structure.

EXPERIMENTAL EXAMPLE

Evaluation of Resin Structure Having Conductive Pattern (1) When conductive patterns were selectively formed according to Examples and Comparative Examples, it was indicated by 'O' in the following Table 1. In contrast, when the non-conductive metal compound was not mixed with the polymer resin, or conductive patterns were not selectively formed, it was indicated by 'X' in the following Table 1.

(2) According to the standard method of ASTM 2244, a colorimeter (color eye 7000 A, X-rite) and a standard light source D65 were used to illuminate a region of the resin structure manufactured according to Examples and Comparative Examples, on which no conductive pattern was formed. L*, a* and b* color coordinates in a color space defined by International Commission on Illumination (CIE) were determined by a color difference with a reference sample material. L* values related to color brightness are shown in Table 1.

(3) Adhesion strengths of conductive patterns (or plating layers) which were formed according to Examples and Comparative Examples were evaluated by a cross-cut test according to the standard ISO 2409. Class 0 indicates that a delamination area of a conductive pattern is 0% of an area of a conductive pattern to be evaluated and Class 1 indicates that a delamination area of a conductive pattern is more than 0% to 5% or less of an area of a conductive pattern to be evaluated. Class 2 indicates that a delamination area of a conductive pattern is more than 5% to 15% or less of an area of a conductive pattern to be evaluated. Class 3 indicates that a delamination area of a conductive pattern is more than 15% to 35% or less of an area of a conductive pattern to be evaluated. Class 4 indicates that a delamination area of a conductive pattern is more than 35% to 65% or less of an area of a conductive pattern to be evaluated. Class 5 indicates that a delamination area of a conductive pattern is more than 65% of an area of a conductive pattern to be evaluated.

(4) MFRs (Melt Flow Rates) of the resin structures manufactured according to Examples and Comparative Examples were measured at a temperature of 300° C. and under a load of 1.2 kg according to ASTMD1238.

TABLE 1

| | Formation of conductive pattern | CIE color coordinate (L*) | ISO class | MFR [g/10 min] |
|---|---|---|---|---|
| Example 1 | O | 84.38 | 1 | 16.4 |
| Example 2 | O | 92.17 | 1 | 17.7 |
| Example 3 | O | 87.21 | 1 | 16.5 |
| Example 4 | O | 84.08 | 1 | 16.6 |
| Example 5 | O | 83.07 | 1 | 16.5 |
| Example 6 | O | 81.49 | 1 | 16.4 |
| Example 7 | O | 76.69 | 1 | 16.8 |
| Comparative Example 1 | O | 35.11 | 1 | 17.8 |
| Comparative Example 2 | X | — | — | — |
| Comparative Example 3 | X | — | — | — |
| Comparative Example 4 | No synthesis of non-conductive metal compound | | | |

The invention claimed is:

1. A composition for forming a conductive pattern by electromagnetic irradiation, comprising:
    a polymer resin; and
    a non-conductive metal compound which is represented by the following Chemical Formula 1 and has a distorted square pyramidal structure, in which Cu or M is surrounded by five oxygen atoms, or a distorted octahedral structure, in which Cu or M is surrounded by six oxygen atoms, wherein a metal core is formed from the non-conductive metal compound by electromagnetic irradiation:

$$Cu_{2-x}M_xP_2O_7 \qquad \text{[Chemical Formula 1]}$$

wherein M is one or more metals selected from the group consisting of Zn, Mg, Ca, Sr and Ba, and x satisfies the condition of 0≤x<2.

2. The composition for forming the conductive pattern by electromagnetic irradiation of claim 1, wherein the polymer resin comprises a thermosetting resin or a thermoplastic resin.

3. The composition for forming the conductive pattern by electromagnetic irradiation of claim 1, wherein the polymer resin comprises one or more selected from the group consisting of an ABS resin, a polyalkyleneterephthalate resin, a polycarbonate resin, a polypropylene resin, and a polyphthalamide resin.

4. The composition for forming the conductive pattern by electromagnetic irradiation of claim 1, wherein the non-conductive metal compound is comprised in an amount of 0.1% by weight to 15% by weight, based on the total composition.

5. The composition for forming the conductive pattern by electromagnetic irradiation of claim 1, further comprising one or more additives selected from the group consisting of a flame retardant, a heat stabilizer, a UV stabilizer, a lubricant, an antioxidant, an inorganic filler, a color additive, an impact modifier, and a functional modifier.

6. A resin structure having a conductive pattern, comprising:
   a polymer resin substrate;
   a non-conductive metal compound that is dispersed in the polymer resin substrate and is represented by Chemical Formula 1, and has a distorted square pyramidal structure, in which Cu or M is surrounded by five oxygen atoms, or a distorted octahedral structure, in which Cu or M is surrounded by six oxygen atoms;
   an adhesion-activated surface having a metal core which is exposed on the surface of a predetermined region of the polymer resin substrate; and
   a conductive metal layer formed on the adhesion-activated surface:

$$Cu_{2-x}M_xP_2O_7 \qquad \text{[Chemical Formula 1]}$$

wherein M is one or more metals selected from the group consisting of Zn, Mg, Ca, Sr and Ba, and x satisfies the condition of 0≤x<2.

7. The resin structure of claim 6, wherein the predetermined region where the adhesion-activated surface and the conductive metal layer are formed correspond to the region of the polymer resin substrate to which an electromagnetic wave is irradiated.

* * * * *